United States Patent [19]
Fukui et al.

[11] Patent Number: 5,573,958
[45] Date of Patent: Nov. 12, 1996

[54] METHOD OF FABRICATING A THIN FILM TRANSISTOR WHEREIN THE GATE TERMINAL IS FORMED AFTER THE GATE INSULATOR

[75] Inventors: Hirofumi Fukui, Taiwa-machi; Masanori Miyazaki, Sendai; Hitoshi Seki, Sendai; Makoto Sasaki, Sendai; Yasuhiko Kasama, Sendai, all of Japan

[73] Assignee: Frontec Incorporated, Sendai, Japan

[21] Appl. No.: 338,713

[22] Filed: Nov. 14, 1994

[30] Foreign Application Priority Data

Nov. 16, 1993 [JP] Japan .................................. 5-311365

[51] Int. Cl.⁶ .................................................. H01L 29/784
[52] U.S. Cl. ........................... 437/21; 437/40 I; 437/101; 437/48; 437/51
[58] Field of Search ...................... 437/21, 40 TFI, 437/41 TFI, 101, 48, 50, 51

[56] References Cited

U.S. PATENT DOCUMENTS

| | | | |
|---|---|---|---|
| 4,803,536 | 2/1989 | Tuan | 257/360 |
| 5,034,340 | 7/1991 | Tanaka et al. | 437/101 |
| 5,045,485 | 9/1991 | Tanaka et al. | 437/101 |
| 5,219,771 | 6/1993 | Miyake | 437/40 |
| 5,384,271 | 1/1995 | Kwasnick et al. | 437/101 |
| 5,407,845 | 4/1995 | Nasu et al. | 437/40 TFI |

FOREIGN PATENT DOCUMENTS 4-241325(A)  8/1992  Japan .

*Primary Examiner*—Mary Wilczewski
*Attorney, Agent, or Firm*—Guy W. Shoup; Patrick T. Bever

[57] ABSTRACT

A method of fabricating a thin film transistor of an inverted stagger structure having a gate terminal, a gate insulator a semiconductor film, a source electrode and a drain electrode formed in that order; a gate terminal and a gate wiring are provided for supplying a scanning signal to the gate electrode; and a source terminal and a source wiring are provided for supplying a data signal to the source electrode, wherein the gate terminal is formed on an upper side of the gate insulating film and electrically connected to the gate wiring through a contact hole formed in the gate insulator.

12 Claims, 9 Drawing Sheets

METHOD OF FABRICATING A THIN FILM TRANSISTOR WHEREIN THE GATE TERMINAL IS FORMED AFTER THE GATE INSULATOR

BACKGROUND OF THE INVENTION

1. Field of the Invention

The present invention relates to a thin film transistor (hereinafter referred to as a TFT) substrate including a substrate and a large number of TFTs formed thereon used for, for example, an active matrix liquid crystal display device and to a method of manufacturing the same. More particularly, the present invention relates to a structure of the TFT substrate having a gate terminal for supplying a scanning signal from a scanning circuit to a gate electrode of the TFT of a inverted stagger structure, and to a method of manufacturing the same.

2. Description of the Related Arts

FIG. 8 shows an example of the TFT substrate used for an active matrix liquid crystal display device. A large number of TFTs 1 of inverted stagger structure are formed longitudinally and latitudinally on a TFT substrate 2 as shown in the figure. A plurality of gate terminals 18 for supplying scanning signals from a scanning circuit to gate electrodes 12 of the TFTs 1 through a gate wiring, and a plurality of source terminals 19 for supplying data signals from a data circuit to source electrodes of the TFTs 1 through a source wiring are formed on the TFT 2. The gate electrodes 12 of each of the TFTs 1 are electrically connected to the gate terminals 18 through the gate wiring 21, and the each of the source electrodes are electrically connected to the source terminals 19 through the gate wiring 22.

The TFT 1, the gate wiring 21, the source wiring 22, the gate terminal 18 and the source terminal 19 of the conventional TFT substrate 2 are arranged in such a manner as shown in FIG. 9(A). The cross sections of the TFT 1, the gate terminal 18 and the source terminal 19 are formed in such manners as shown in the cross sectional views of the FIGS. 9(B) to 9(D), respectively. FIGS. 9(B) to 9(D) are cross sectional views of FIG. 9(A) taken on lines A—A, B—B and C—C, respectively. A conductive material constituting the gate terminal 18 is formed into a film together with the conductive material constituting the gate electrode 12 and the gate wiring 21.

As shown in FIG. 9(D), the source terminal 19 is formed on a gate insulator 13 which is formed on a substrate 11. Only a passivation film 27 is formed on the conductive material constituting the source terminal 19, and the passivation film 27 formed on the conductive material are processed and removed so that the source terminals 19 can be electrically connected to the terminals of a data circuit.

In contrast to this, since the conductive material constituting the gate terminal 18 is formed into a film together with the gate electrode 12, as shown in FIG. 9(C), it is formed directly on the substrate 11. The gate insulator 13 is formed on the conductive material constituting the gate terminal 18, and the passivation film 27 is formed thereon. Two kinds of these insulating films formed on the gate terminal 18 are processed and removed by a separate process, respectively so as to be electrically connected to the terminals from the scanning circuit. An effective contact width (S0) of the source terminal 19 and an effective contact width (G0) of the gate terminal 18 should be securely connected to the terminals from a driving circuit. Usually, these effective contact widths S0 and G0 are equal (G0=S0).

A width (S1) of the conductive material constituting the source terminal 19 should be longer than the effective contact width (S0) of the source terminal 19, and the difference (S1–S0) between these two widths should be at least two times a sum of process accuracy and a mask alignment accuracy (hereinafter referred to as process accuracy) (C1) (that is to say, S1=S0+C1+C1).

In a similar manner as that described above, a width (G11) of the conductive material constituting the gate terminal 18 should be longer than the effective contact width (G0) of the gate terminal 18, and the difference (G11–G0) between these two widths should be at least two times the process accuracies (C3 and C2) of each of the films (the gate insulator 13 and the passivation film 27 (that is to say, G11=G0+C3+C2+C2+C3). Since each of process accuracies are equal to each other (C1=C2=C3), the width of the conductive material constituting the source terminal 19 {S1=S0+(2×C1)} will be different from that of the conductive material constituting the gate terminal 18 {G11=G0+(4×C1)}. Thus, when G0 and S0 are equal to each other, the width of the conductive material constituting the gate terminal 18 should be elongated by about two times the process accuracy (2×C1).

This difference (2×C1) does not affect on the TFT substrate in the case where a large number of the gate terminals 18 can be arranged with wide spaces therebetween. However, in case of the TFT substrate used for the active matrix liquid crystal display device for which densification of display is required, it becomes necessary to narrow the spaces between a large number of the gate terminals 18 arranged on the substrate, and the difference (2×C1) becomes a large problem. That is to say, there is a serious problem that the necessary gate terminals 18 cannot be arranged in the limited area and that densification of display is inhibited.

SUMMARY OF THE INVENTION

It is an object of the present invention to provide a thin film transistor substrate adaptable to the densification of the gate terminals and a method of manufacturing the same.

In order to achieve the above object, according to an aspect of the present invention, there is provided a thin film transistor substrate comprising a substrate; a thin film transistor of an inverted stagger structure having a gate electrode, a gate insulator, a semiconductor active film, a source electrode and a drain electrode formed on the substrate in that order; a gate terminal and a gate wiring formed on the substrate for supplying a scanning signal to the gate electrode; and a source terminal and a source wiring formed on the substrate for supplying a data signal to the source electrode, wherein the gate terminal is formed above the gate insulator and electrically connected to the gate wiring through a contact hole formed in the gate insulator.

According to another aspect of the present invention, there is provided a method of manufacturing a thin film transistor having the components as described above, wherein a conductive material constituting the gate terminal is formed after the formation of the gate insulator.

According to further aspect of the present invention, there is provided a method of manufacturing a thin film transistor having the components as described above and a guard ring formed on the substrate connecting the source wiring to the gate wiring at the periphery of substrate which comprises the steps of forming the gate electrode and the gate wiring on the substrate; forming the gate insulator covering the gate electrode and the gate wiring; forming the semiconductor film on the gate insulator; forming an ohmic contact layer on the semiconductor film; forming the semiconductor film and the ohmic contact layer into predetermined shape; forming a contact hole in the gate insulator formed on the gate wiring; forming a conductive material into a film on the ohmic contact layer; forming a resist film for processing the conductive film into a predetermined shape; forming the gate terminal and the guard ring electrically connected to the gate wiring through the source electrode, the drain electrode, the source wiring and the contact hole by etching the conductive film using the resist film; and forming a channel of the thin film transistor by actuating an etchant on the ohmic contact layer with regarding the resist film as a mask.

DESCRIPTION OF THE PREFERRED EMBODIMENTS

A general concept of the present invention will be described with reference to the accompanying drawings.

Figure 1A:
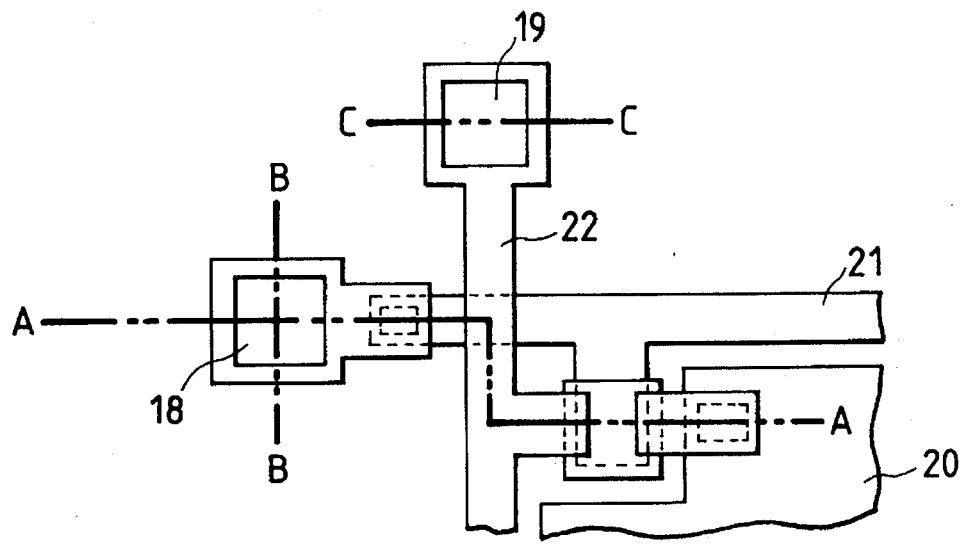
FIG. 1(A) is a schematic plan view showing a first embodiment of a thin film transistor according to the present invention.
Figure 1B:
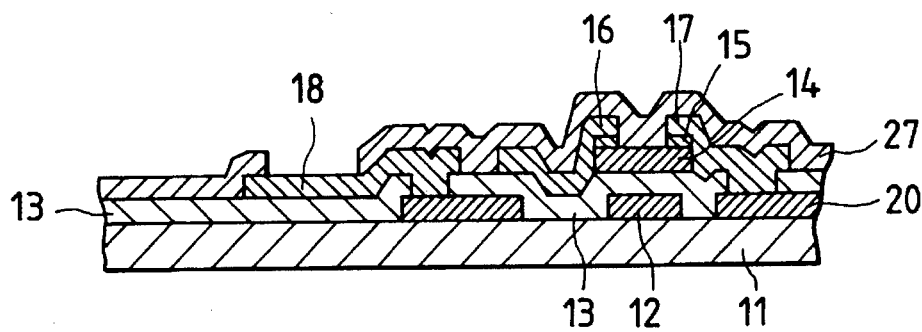
FIGS. 1(B), 1(C) and 1(D) are cross sectional views of FIG. 1(A) taken on lines A—A, B—B and C—C, respectively.
Figure 1C:
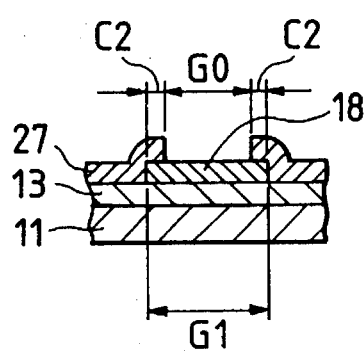
Figure 1D:
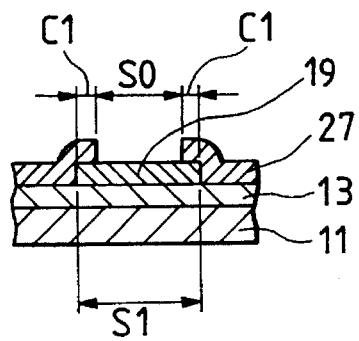

FIG. 1(A) is a schematic plan view showing an example a TFT substrate according to the present invention, and FIGS. 1(B) to 1(D) are cross sectional views of FIG. 1(A) taken on lines A—A, B—B and C—C, respectively.

Figure 9A:
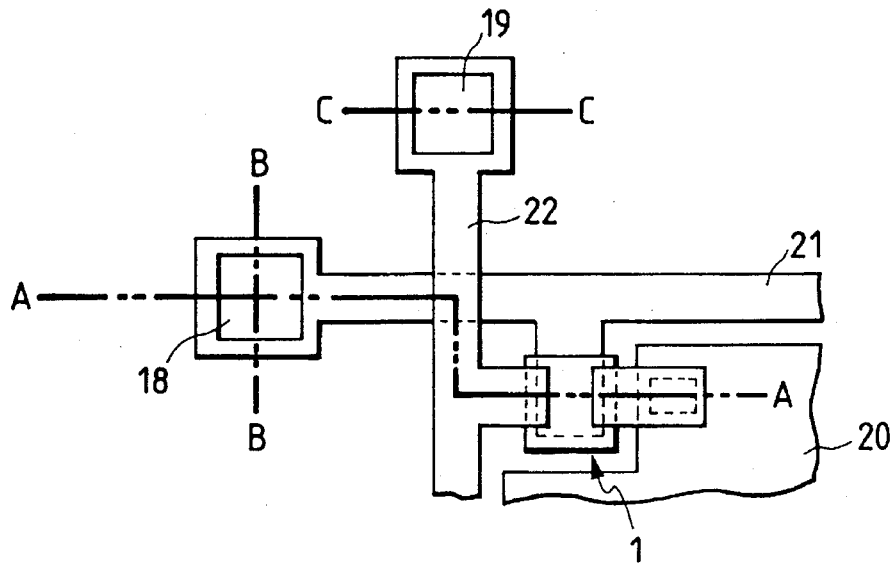
FIG. 9(A) is a schematic plan view showing a conventional TFT.
Figure 9B:
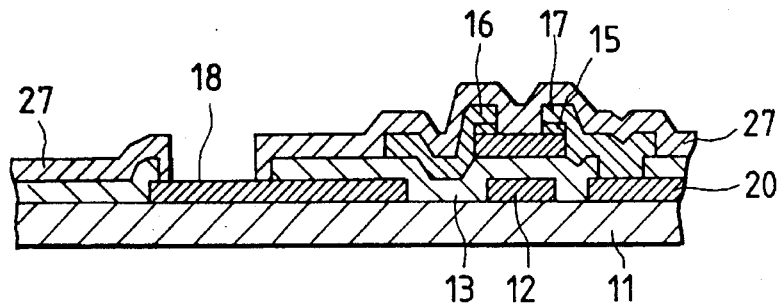
FIGS. 9(B), 9(C) and 9(D) are cross sectional views of FIG. 9(A) taken on lines A—A, B—B and C—C, respectively.
Figure 9C:
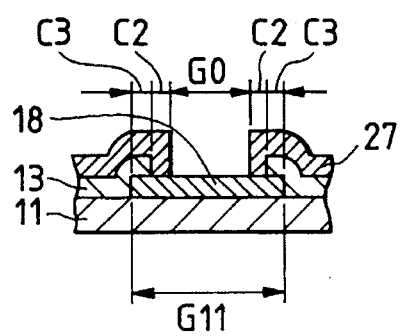
Figure 9D:
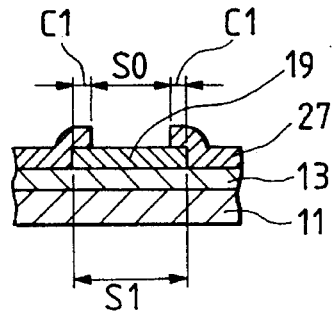

As to the source terminal 19 shown in FIG. 1(D), the conductive material constituting the source terminal 19 is formed on the gate insulating film 13 formed on the substrate 11, and only the passivation film 27 is formed on the conductive material, and further, the passivation film 27 is processed and removed so as to be electrically connected to the terminals from the data circuit in the same manner as that shown in FIG. 9(D).

Also, as to the gate terminal 18, the conductive material constituting the gate terminal 18 is formed on the gate insulator 13 and only the passivation film 27 is formed on the conductive material. Thus, the width (G1) of the conductive material constituting the gate terminal 18 should be longer than the effective contact width (G0) of the gate terminal 18, but the difference (G1–G0) may be two times of the process accuracy (C2) of the passivation film 27. The width of the conductive material constituting the source terminal 19 (S1=S0+C1+C2) and the width of the conductive material constituting the gate terminal 18 (G1=G0+C2+C2) are equal to G1=S1=G0+(2×C1) because S0 is equal to G0 and C1 is equal to C2, as previously described. Accordingly, the width of the gate terminal 18 of the present invention can be narrower than that of the conventional gate terminal 18 (G11=G0+(4×C1), thereby obtaining a denser arrangement of the gate terminal 18.

When the conductive material constituting the gate terminal 18 is formed of the same conductive material as that constituting the source wiring of the TFT, both conductive materials can be simultaneously processed into films and a need for adding a step to accomplish the densification of the gate terminal can be eliminated.

Further, when the semiconductor film is formed of amorphous silicon having a thickness within the range of 20 to 60 nm, a current value (hereinafter referred to as $I_{off}$) of the OFF-state of the TFT is not increased by a stray light. In the conventional TFT, the semiconductor film is formed of amorphous silicon having a thickness within the range of 100 to 200 nm. Therefore, when a back light of the liquid crystal device is applied to the semiconductor film, the $I_{off}$ increases about four times, whereby it is difficult to obtain sufficient TFT properties.

In a specific method in accordance with the present invention, the gate terminal 18 is formed after the formation of the gate insulator 13. Thus, the conductive material constituting the gate terminal 18 is formed on the gate insulator 13 and only the passivation film 27 is formed on the conductive material. Therefore, the TFT substrate can be securely achieved with efficiency.

When the conductive material constituting the gate terminal 18 is formed of the same conductive material as that constituting the source wiring 22 of the TFT, a need for adding extra steps can be eliminated.

Figure 2A:
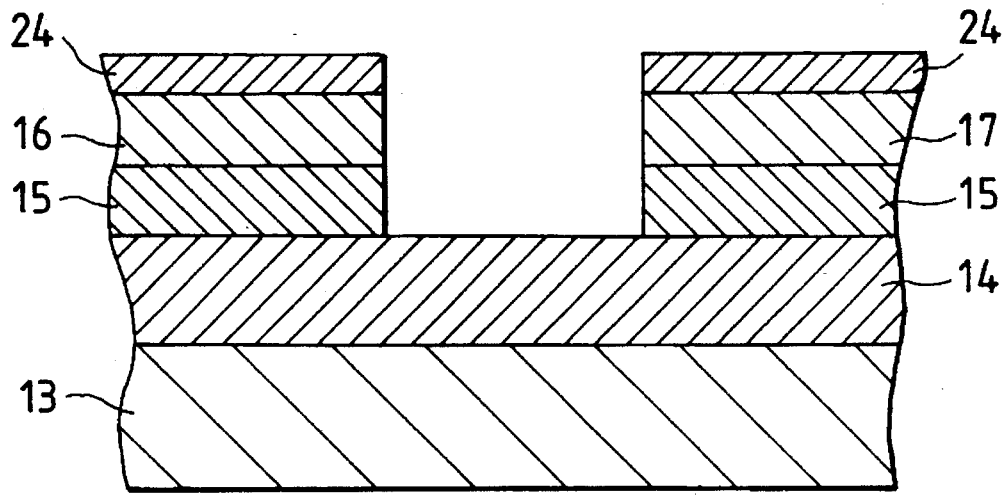
FIGS. 2(A) and 2(B) show section views of a side etching of a ohmic contact layer due to a battery effect.
Figure 2B:
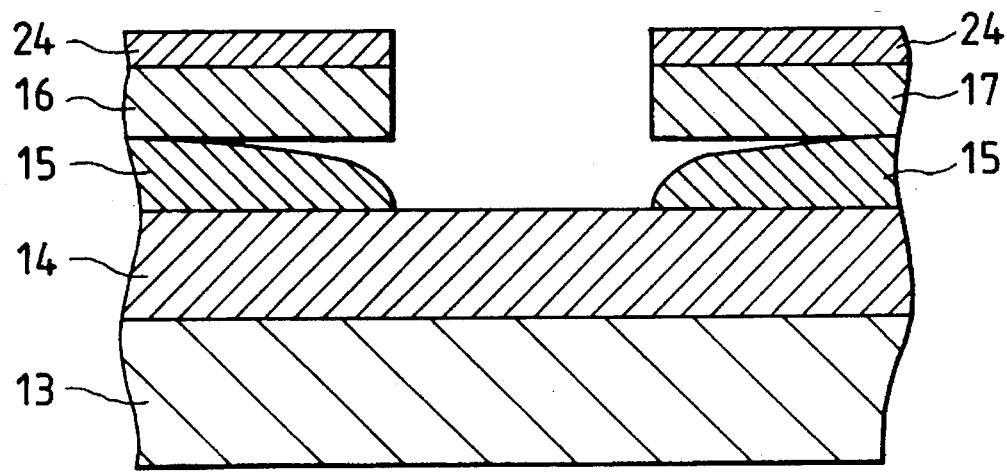

In case of the conventional TFT substrate provided with a guard ring, when the channel is formed by etching the ohmic contact layer 15 of the TFT, the ohmic contact layer 15 may be side etched as shown in FIG. 2(B).

The ohmic contact layer 15 is electrically connected to the source electrode 16 formed directly above thereof through the source wiring, the guard ring, the gate terminal (formed of the same conductive material as that of the gate terminal and the gate wiring), the gate wiring, and the gate electrode. The surfaces of the source electrode 16, the source wiring, the guard ring, the gate wiring, and the gate electrode are all covered with the gate insulator 13 or the resist film 24 both of which are insulators.

However, the surface of the gate terminal are not covered with the gate insulator.

Figure 3A:
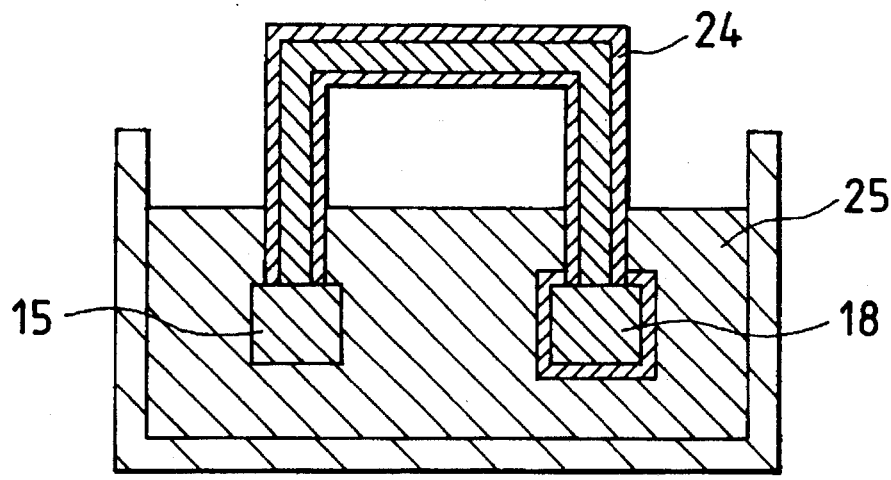
FIGS. 3(A) and 3(B) show section views of a battery effect of a step of forming a channel.
Figure 3B:
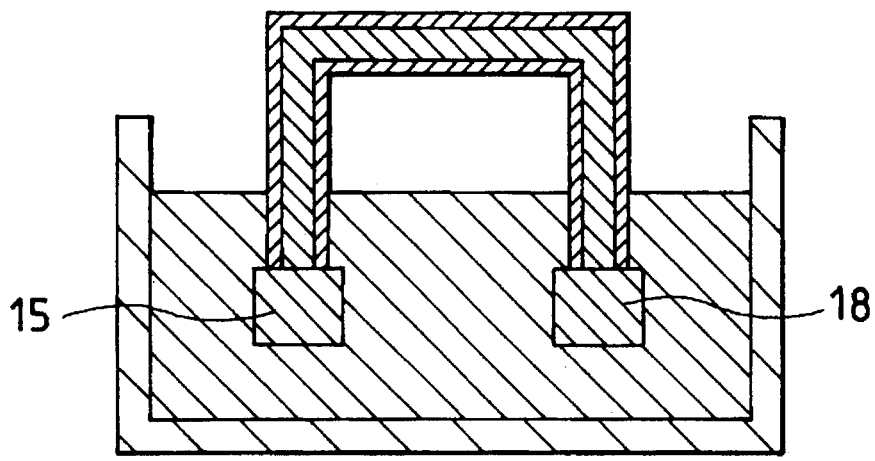

When the ohmic contact layer 15 is dipped in an etchant, the gate terminal 18 electrically connected to the ohmic contact layer 15 is exposed, thereby forming a galvanic battery by the ohmic contact layer 15 and the conductive material constituting the gate terminal 18, as shown schematically in FIG. 3(B). As a result, the ohmic contact layer 15 is side. etched abnormally due to a galvanic effect, as shown in FIG. 2(B).

On the other hand, in a specific form of a method in accordance with the present invention, as shown in FIG. 4, when the channel is formed by etching the ohmic contact layer 15 with regard to resist film 24 masking, the ohmic contact layer 15 is electrically connected to the source electrode 16 formed directly above thereof through the source wiring 22, the guard ring 28, the gate terminal 18, the gate wiring 21 and the gate electrode 12, but the surfaces of the gate terminal 18, the gate wiring 21 and the gate electrode 12 are all covered with the gate insulator 13 or the conductive materials constituting the source wiring 22 and the guard ring 28, and these conductive materials are all covered with the resist film 24, which is an insulator. That is to say, when the channel 26 of the TFT is formed, all members electrically connected to the ohmic contact layer 15 are covered with the insulators. Therefore, as shown schematically in FIG. 3(A), the ohmic contact layer 15 does not form a galvanic battery with the other conductive member when the etchant 25, an electrolyte, is actuated thereon. Thus, the ohmic contact layer 15 can be prevented from the abnormal side etching due to a galvanic effect as shown in FIG. 2(A).

The guard ring 28 prevents a main portion of the TFT from being destroyed due to ESD (electro static discharge) during the processes. The source terminal 19 and the gate terminal 18 are directly short-circuited or short-circuited through a nonlinear device such as a diode or a TFT. When the source terminal 19 and the gate terminal 18 are directly short-circuited, the guard ring 28 is removed in the final process to complete the TFT substrate.

Conventionally, the ohmic contact layer has been processed by a dry etching process in order to prevent the large side etching. In contrast to this, according to a method of the present invention, the ohmic contact layer 15 can be prevented from being abnormally side etched, as shown in FIG. 2(A) even if it is processed by a wet etching process. In the dry etching process, the thickness of the semiconductor film should be at least 100 nm because etching selectivity between the semiconductor film and the ohmic contact layer comprising the semiconductor film to which a small amount phosphate is added can not be obtained. In the wet etching process, a sufficient selectivity can be obtained. Thus, the thickness of the semiconductor film can be within the range of 20 to 60 nm.

In the present invention, a material of the conductive layer constituting the gate wiring, the gate electrode, etc. may preferably have high adhesive properties and a low resistance against the substrate. For example, chromium, aluminum and copper may be used. A thickness of the film are preferably within the range of 50 to 100 nm. A material of the conductive layer constituting the source electrode, the source wiring and the gate terminal, etc. is selected from those having a low resistance and in relation to the ohmic contact layer. Copper and aluminum, etc. are preferably used. The conductive layer is not limited to have a single-layer construction. The conductive layer having a multi-layer construction may be used.

As a material of the gate insulation silicon nitride and silicon oxide are preferably used, but it is not limited thereto. A thickness of the gate insulation is preferably within the range of 50 to 500 nm.

Polycrystalline silicon or amorphous silicon may be used as a material of the semiconductor film and the ohmic contact layer of the present invention. Particularly, the amorphous silicon is preferably used.

Various kinds of materials are used for the substrate. A glass substrate such as CORNING 7059 (trade-name; manufactured by CORNING JAPAN K.K.) may be used.

The present invention will be described in detail by way of embodiments with reference to the accompanying drawings.

First Embodiment

FIGS. 1(A) to 1(D) are a schematic diagrams showing a first embodiment of the present invention. FIG. 1(A) is a plan view, FIGS. 1(B) to 1(D) are cross sectional views taken on lines A—A, B—B and C—C in FIG. 1(A), respectively.

Firstly, a structure of the TFT substrate will be described. The TFT is of inverted stagger structure. The gate electrode 12 formed of chromium having a width of 10 μm and a thickness of 100 nm, and the gate wiring 21 formed of chromium for supplying a scanning signal to the gate electrode 12 are formed on a glass substrate 11 (CORNING 7059). A gate insulation 13 formed of a silicon nitride film having a thickness of 200 nm is formed on the gate electrode 12 and the gate wiring 21. The semiconductor active film 14 formed of amorphous silicon having a thickness of 50 nm, the source electrode 16 formed of aluminum having a thickness of 100 nm and a width of 10 μm, and a drain electrode 17 are formed on the gate insulation 13.

A phosphate-added amorphous ohmic contact layer 15 having a thickness of 20 nm is formed between the semiconductor film 14, the source electrode 16 and the drain electrode 17.

Figure 8:
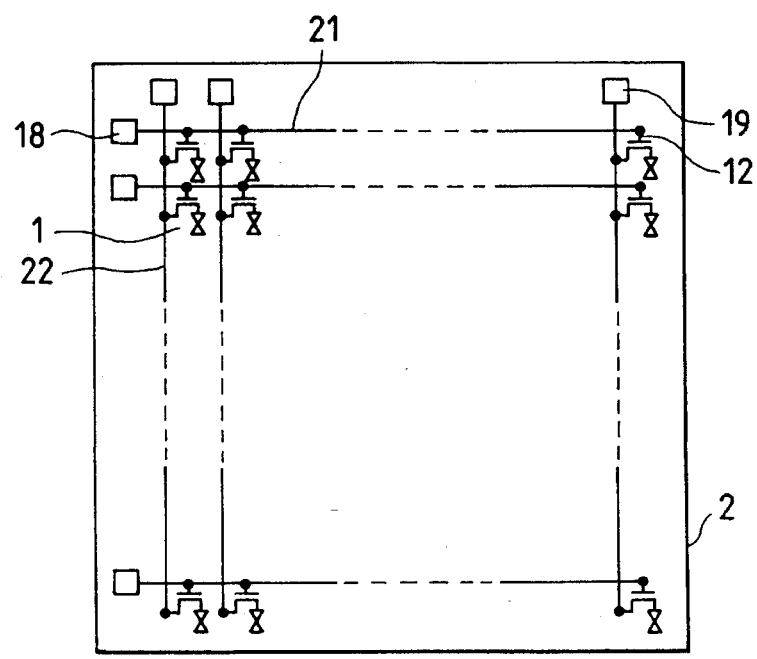
FIG. 8 illustrates a concept of one example of a TFT substrate.

A large number of such TFTs as described above are formed longitudinally and latitudinally on a substrate as shown in FIG. 8 with a pitches of 100 μm. The source terminal 19 for supplying a picture signal from an external picture signal circuit to the source electrode 16 through a source wiring 22, and a gate terminal 18 for supplying a scanning signal from an external scanning circuit to the gate electrode 12 through the gate wiring 21 are formed on the peripheral portion of the substrate 11 provided with TFTs 1.

Aluminum, which is the same conductive material as that of the source electrode 16 and the source wiring 22, is used for the source terminal 19. The gate terminal 18 formed of aluminum, which is the same conductive material as that of the source wiring 22, is formed on the upper side of the gate insulator 13 and contacts the gate wiring 21 through a contact hole formed in the gate insulator 13 which is formed on the gate wiring 21.

A passivation film 27 formed of a silicon nitride film having a thickness of 300 nm is formed on the TFT 1, the gate wiring 21, the source wiring 22, the source terminal 19 and the gate terminal 18. However, the surfaces of the source terminal 19 and the gate terminal 18 are partially exposed so as to be electrically connected to the picture signal circuit and the scanning circuit. The widths S1 and G1 of the conductive materials constituting the source terminal 19 and the gate terminal 18 are both 50 μm, and the effective connection widths (S0 and G0) of the source terminal 19 and the gate terminal 18 excluding the passivation films 27 formed thereon are both 42 μm. That is to say, the process accuracies as described above of the source terminal 19 and the gate terminal 18 are both 4 μm.

In the conventional structure, the width of the conductive material constituting the gate terminal 18 should be 58 μm (42 μm+4×4 μm) to obtain 42 μm of effective connection width of the gate terminal 18. In contrast to this, according to the present invention, the arrangement density of the gate terminal 18 in a fixed area increases by about 8%, thereby obtaining TFT substrate 2 loading TFTs in a higher density.

This effect becomes more conspicuous as the arrangement pitch of the gate terminal 18 becomes narrower. For example, in order to obtain 30 μm of the effective connection width of the gate terminal 18, and to obtain 30 μm of the distance between the gate terminals 18, the arrangement pitch of the gate terminal is 76 μm in the conventional constitution, while 68 μm according to the present invention, thereby decreasing the arrangement pitch of the gate terminal by about 12%.

A method of manufacturing TFT substrate according to the present invention will be described.

Figure 5A:
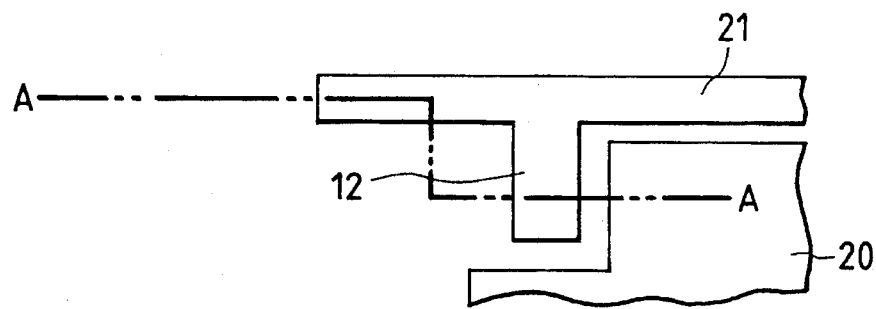
FIG. 5(A) is a schematic plan view showing one step of a method of manufacturing a thin film transistor substrate according to the present invention.
Figure 5B:
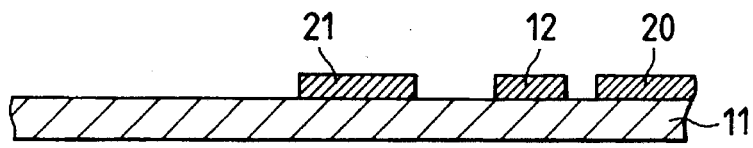
FIG. 5(B) is a cross sectional view taken on line A—A.

Firstly, a chromium film having a thickness of 100 nm is formed by a sputter deposition method on the glass substrate 11 provided with a pixel electrode 20 formed of a transparent conductive film. The surface of the chromium thin film is subjected to processes of resist-coating, exposure, development, etching and resist stripping to form the desired shape of the gate electrode 12 and the gate wiring 21. This situation is shown in FIGS. 5(A) and 5(B). FIG. 5(A) is a schematic plan view, and FIG. 5(B) is a cross sectional view taken on line A—A in FIG. 5(A).

A gate insulator 13 formed of a silicon nitride film having a thickness of 200 nm, an amorphous silicon semiconductor film 14 having a thickness of 50 nm and a phosphate-doped amorphous ohmic contact layer 15 are formed by a plasma CVD method on the surface of the substrate 11 provided with the gate electrode 12 and the gate wiring 21.

Figure 6A:
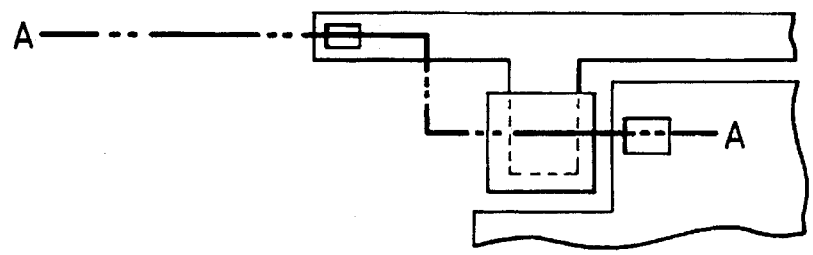
FIG. 6(A) is a schematic plan view showing one step of a method of manufacturing a thin film transistor substrate according to the present invention.
Figure 6B:
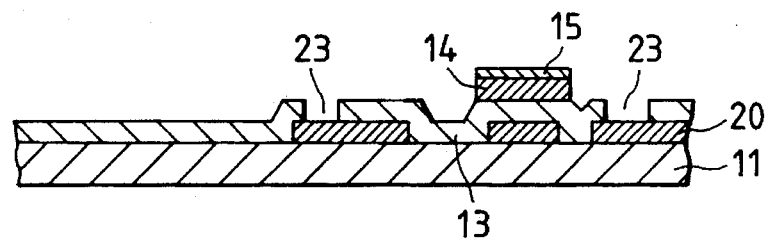
FIG. 6(B) is a cross sectional view taken on line A—A.

The semiconductor active film 14 and the ohmic contact layer 15 are subjected to a photolithographic process to form a desired shape of a semiconductor island. A contact hole 23 is formed in the gate/insulator 13 formed on the pixel electrode 20 and the gate wiring 21. This situation is shown in FIGS. 6(A) and 6(B). FIG. 6(A) is a schematic plan view, and FIG. 6(B) is a cross sectional view taken on line A—A in FIG. 6(A).

Figure 4A:
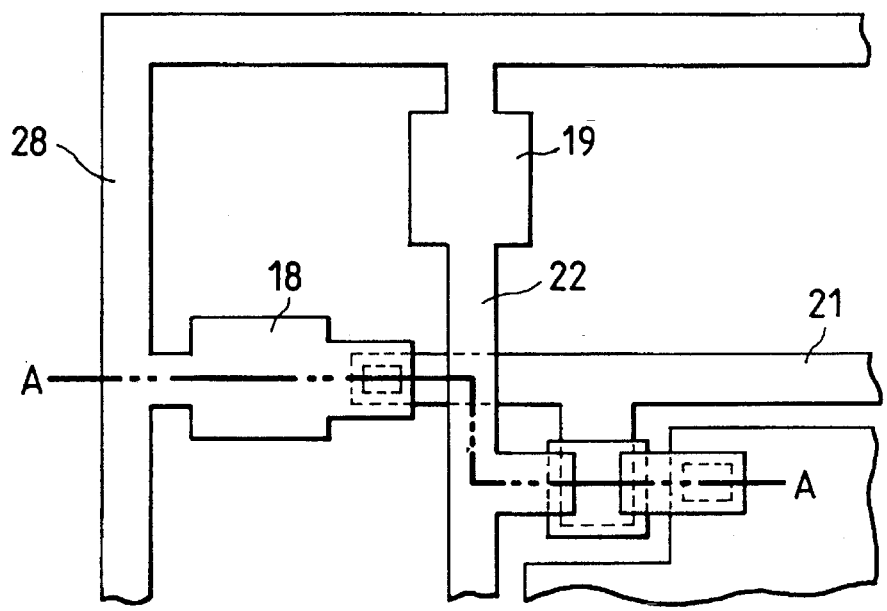
FIG. 4(A) is a schematic plan view showing one step of a method of manufacturing a thin film transistor substrate according to the present invention.
Figure 4B:
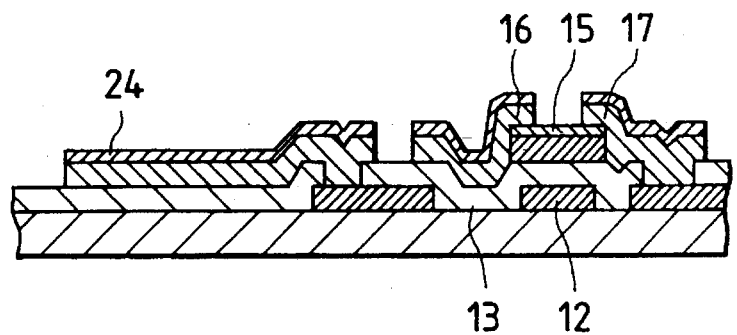
FIG. 4(B) is a cross sectional view taken on line A—A of the FIG. 4(A)

Successively, an aluminum film having a thickness of 100 nm is formed by a sputter deposition method on the substrate 11 including the ohmic contact layer 15. The resist film 24 is formed on the surface of the aluminum film and then subjected to the processes of exposure, development and etching to form a source electrode 16, a source wiring 22, a source terminal 19, a drain electrode 17, a guard ring 28 electrically connecting the source terminal 19 to the gate terminal 18, and the gate terminal 18. In this case, the gate terminal 18 is formed by processing a conductive material so that the gate wiring 21 under the contact hole 23 is completely covered with the aluminum wiring. FIG. 4(A) is a schematic plan view of this situation, and FIG. 4(B) is a cross sectional view taken on line A—A in FIG. 4(A).

Figure 4C:
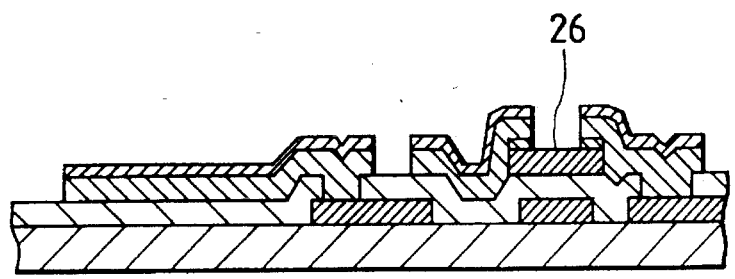
FIG. 4(C) is a schematic view for explaining a manufacturing steps.

Then, an etchant 25 is actuated on the ohmic contact layer 15 wherein the resist film 24 is used as a mask to form a channel 26 (FIG. 4(C)) of TFT 1. If a conductive member electrically connected to the ohmic contact layer 15 is immersed in the etchant 25 together with the ohmic contact layer 15 as shown in FIG. 3(B), the ohmic contact layer 15 is side etched abnormally as shown in FIG. 2(B). However, according to this embodiment, the ohmic contact layer 15 is not significantly side etched, as shown in FIG. 2(A), This is because, as shown in FIGS. 4(A) to 4(C), the surfaces of the gate terminal 18, the gate wiring 21 and the gate electrode 12 are all covered with the gate insulator 13 which is an insulator, or a conductive material constituting the source wiring 22, and the conductive materials constituting the source wiring 22, the source terminal and the guard ring 28 are all covered with the resist film 24 which is an insulator, though the ohmic contact layer 15 is electrically connected to the source electrode 16 formed directly above thereof through the source wiring 22, the source terminal, the guard ring 28, the gate terminal 18, the gate wiring 21 and the gate electrode 12. That is to say, as shown schematically in FIG. 3(A), since the conductive members electrically connected to the ohmic contact layer 15 are all covered with the insulators, the ohmic contact layer 15 does not form a galvanic battery with the other conductive members when the etchant 25, electrolyte, is actuated thereon. Thus, the ohmic contact layer 15 can be prevented from the large side etching due to a galvanic effect.

Then, a passivation film 27 formed of a silicon nitride film is formed, and the surface of the passivation film 27 is subjected to the processes of resist film forming, mask exposure, development, etching and resist stripping to expose the source terminal 19 and the gate terminal 18. Since the gate terminal 18 is formed above the gate insulator 13, it can be formed by only removing the passivation film 27 in the same manner as that of the source terminal. Further, the guard ring 28 connecting the gate wiring 21 and the source wiring 22 is removed to form the TFT substrate shown in FIGS. 1(A) to 1(C).

In such a manner as described above, the TFT substrate having the substrate 11 on which a large number of TFTs are formed longitudinally and latitudinally with pitches of 100 μm, and having the source terminal 19 for supplying a picture signal from the external picture signal circuit to the source electrode 16 through the source wiring 22 and the gate terminal 18 for supplying a scanning signal from the external scanning circuit to the gate electrode 12 through the gate wiring 21 formed on the peripheral portion of the substrate 11.

Figure 7:
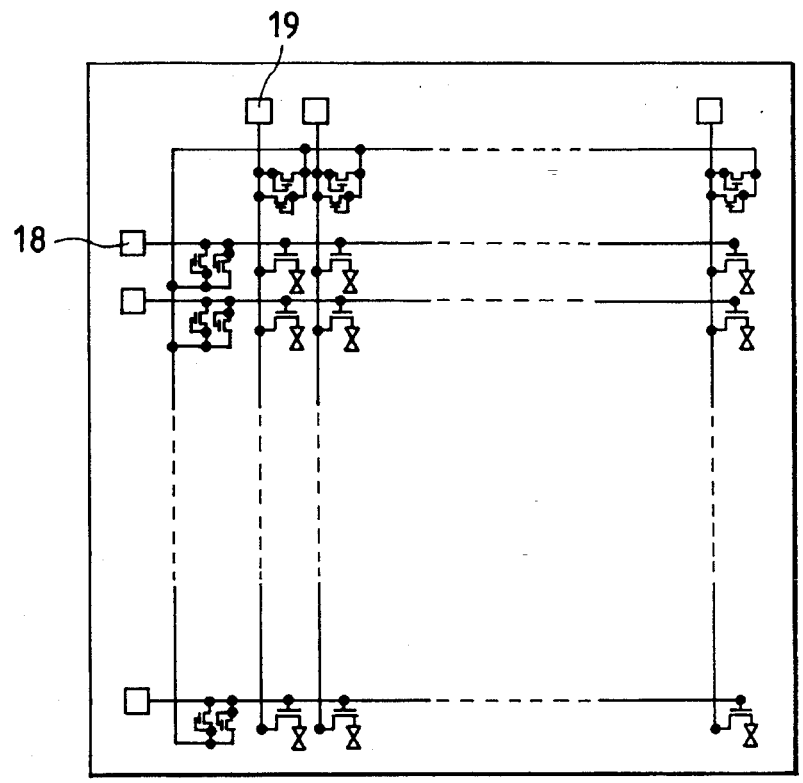
FIG. 7 illustrates a concept of one example of a TFT substrate.

In this embodiment, the source terminal 19 and the gate terminal 18 are directly short-circuited. However, the source terminal 19 can be connected to the gate terminal through the TFT, as an equivalent circuit shown in FIG. 7. In this case, it is not necessary to remove the guard ring 28 including the TFT in the final step.

Second Embodiment

Different from the first embodiment as described above, copper is used as a material for the gate electrode and the gate wiring. According to this embodiment, the material of the gate electrode and the gate wiring is merely changed, and the same TFT substrate properties and manufacturing effect as those in the first embodiment can be obtained. Further, low resistance properties, which are the excellent properties of copper, can be fully given.

Conventionally, use of copper which is a material having a low resistance material, as the material for the gate electrode and gate wiring of the TFT substrate has been attempted especially in a switching substrate of an active matrix liquid crystal device in which a length of wiring is extended. However, copper has not yet adopted due to the fact that back light is heavily used in the active matrix liquid crystal device, that amorphous silicon having photoconductivity is suitable for a semiconductor film and that copper does not have sufficient light-shielding properties.

Figure 10A:
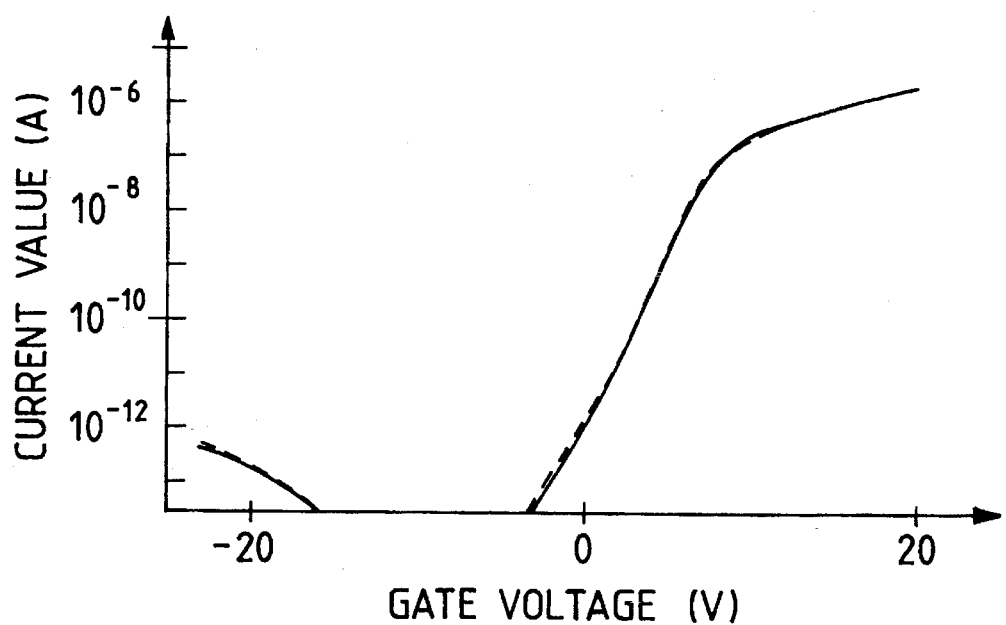
FIG. 10(A) shows operating properties of TFT of a second embodiment according to the present invention.
Figure 10B:
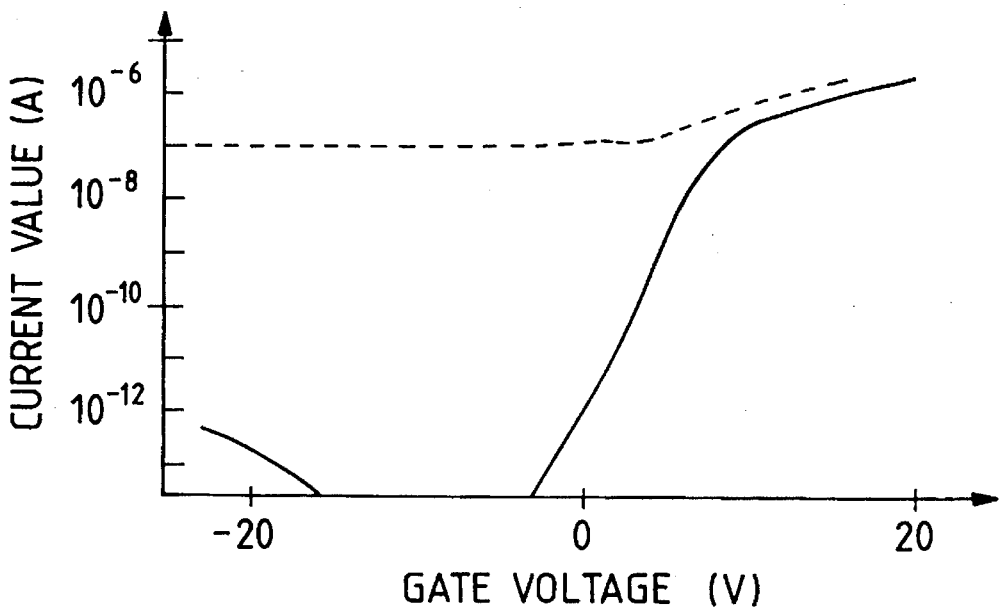
FIG. 10(B) shows operating properties of TFT of a comparative example.

In contrast to this, according to this embodiment, since the thickness of the semiconductor film is thin, photoconductivity of the semiconductor film is not generated even if light is applied thereto. The operating characteristics of the TFT when 7000 cd of light is applied from a rear face through the substrate to the TFT in which amorphous silicon having a thickness of 50 nm is used as the semiconductor film, and copper having a width of 10 μm and a thickness of 100 nm is used as the gate electrode and the gate wiring, and the operating characteristics of such TFT when light is not applied thereto are shown in FIG. 10(A). As a comparative example, the same operating characteristics of the TFT as described above manufactured by the same manner as described above except that the semiconductor film having a thickness of 100 nm is used are shown in FIG. 10(B). In FIGS. 10(A) and 10(B), a case when the light is applied is shown by dashed lines, and a case when the light is not applied is shown by solid lines.

Apparent from FIG. 10(B), in the comparative example, the OFF-state current value has increased by more than four figures due to application of the light, and a sufficient ratio of ON-state current value versus OFF-state current value can not be obtained. In contrast to this, according to this embodiment in which amorphous silicon having a thickness of 50 nm is used as the semiconductor film, a sufficient ratio of ON-state current value versus OFF-state current value of more than six figures can be obtained even when light is applied. By this, sufficient TFT characteristics can be obtained even when a material having low light shielding properties and a high conductivity such as copper is used.

Figure 11:
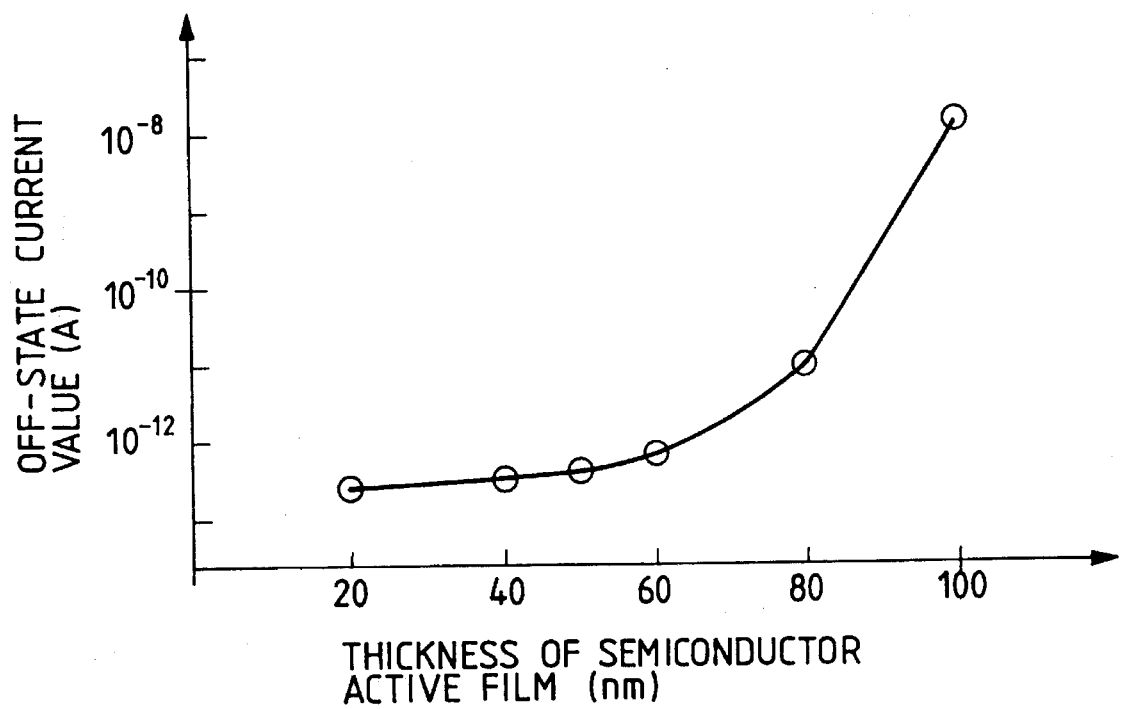
FIG. 11 is a graph showing a relation between a thickness of a semiconductor film formed of amorphous silicon and OFF-state current value upon application of light.

The relation between the thickness of the semiconductor film formed of amorphous silicon and OFF-state current value upon application of light is shown in FIG. 11. It is apparent from FIG. 11 that a sufficient ratio of ON-state current value versus OFF-state current value of more than six figures can be obtained even when light is applied, when the thickness of the semiconductor film formed of amorphous silicon is 60 nm or less. If the thickness of the semiconductor film formed of amorphous silicon is less than 20 nm, characteristics of the TFT become unstable regardless of the presence or absence of application of light. Therefore, the thickness of the semiconductor film formed of amorphous silicon is preferably within the range of 60 to 20 nm.

In this embodiment, copper is used for the gate electrode. However, use of a transparent conductive film such as ITO (indium-tin oxide) can offers the same advantage as described above.

As has been described above, according to the present invention, the width of the conductive material constituting the number of gate terminals to be arranged on the substrate can be narrowed. As a result, the necessary gate terminals can be arranged in the limited area, thereby more increasing densification of display of the TFT substrate used for, for example, an active matrix liquid crystal display device.

In one form of the invention, there is provided a thin film transistor substrate, wherein the gate terminal is formed of the same conductive material as that of the source wiring. This feature of the invention offers the following advantage. The densification of display of the TFT substrate used for the active matrix liquid crystal display device can be securely increased at a low cost.

In an another form of the invention, there is provided a thin film transistor substrate, wherein the semiconductor film is formed of amorphous silicon having a thickness within the range of 20 to 60 nm. This feature of the invention offers the following advantages. The ratio of ON-state current value versus OFF-state current value upon application of light is increased. A transparent conductive film such as ITO, and copper having a low light shielding properties and a high conductivity can be used as the gate terminal when the thin film transistor substrate according to the present invention is applied to the liquid crystal display device which uses a back light.

In a further form of the invention there is provided a method of manufacturing a thin film transistor substrate comprising the steps of forming the gate electrode and the gate wiring on the substrate; forming the gate insulator covering the gate electrode and the gate wiring; forming the semiconductor film on the gate insulator forming an ohmic contact layer on the semiconductor active film; forming the semiconductor film and the ohmic contact layer into predetermined shape; forming a contact hole in the gate insulator formed on the gate wiring; forming a conductive material into a film on the ohmic contact layer; forming a resist film for processing the conductive film into a predetermined shape; forming the gate terminal and the guard ring electrically connected to the gate wiring through the source electrode, the drain electrode, the source wiring and the contact hole by etching the conductive film using the resist film; and forming a channel of the thin film transistor by actuating an etchant on the ohmic contact layer with regarding the resist film as a mask. This feature of the invention offers the following advantages. Since an abnormal side etching of the ohmic contact layer can be prevented, a construction of a channel with a good reproducibility can be obtained without providing an etch stopper thereto. As a result, the TFT having stable characteristics can be obtained with a good reproducibility. And, since the channel can be formed by wet etching process, the semiconductor film can have a thickness within the range of 20 to 60 nm. As a result, the material of the gate electrode can be selected even if the semiconductor film formed of amorphous silicon is used without concern for photoconductivity thereof.

What is claimed is:

1. A method of manufacturing a thin film transistor device comprising the steps of:

forming a gate electrode and a gate wiring on a substrate;

depositing a gate insulator on the gate electrode, the gate wiring and the substrate;

forming a contact hole through said gate insulator to expose a portion of the gate wiring;

depositing a conductive material layer over the gate insulator and the exposed portion of the gate wiring; and etching the conductive material layer to form a source electrode, a drain electrode, a source wiring, a source terminal, and a gate terminal, the gate terminal being electrically connected to said gate wiring through the contact hole.

2. The method of manufacturing a thin film transistor device according to claim 1, wherein the step of forming the gate electrode and the gate wiring comprises the steps of depositing an indium tin oxide layer; and etching the indium tin oxide layer to form the gate electrode and the gate wiring.

3. The method of manufacturing a thin film transistor device according to claim 1, wherein the step of forming the gate electrode and the gate wiring comprises the steps of depositing a copper layer; and etching the copper layer to form the gate electrode and the gate wiring.

4. The method of manufacturing a thin film transistor device according to claim 1, further comprising the steps of:

after the step of depositing the gate insulator, depositing a semiconductor film on the gate insulator over the gate electrode;

depositing an ohmic contact layer on said semiconductor film; and forming said semiconductor film and said ohmic contact layer into a predetermined shape.

5. The method of manufacturing a thin film transistor device according to claim 4, wherein the step of depositing the semiconductor film comprises depositing amorphous silicon having a thickness within the range of 20 to 60 nm.

6. The method of manufacturing a thin film transistor device according to claim 1, further comprising the steps of:

after the step of etching the conductive material layer;

depositing a passivation layer; and exposing portions of the source terminal and the gate terminal through the passivation layer.

7. A method of manufacturing a thin film transistor device comprising the steps of:

depositing a first conductive material layer on a substrate;

processing the first conductive material layer to form a gate electrode and a gate wiring;

depositing a gate insulator on the gate electrode, the gate wiring and exposed portions of the substrate;

depositing a semiconductor film on the gate insulator over the gate electrode;

depositing an ohmic contact layer on said semiconductor film;

forming said semiconductor film and said ohmic contact layer into a predetermined shape;

depositing a second conductive material layer on the ohmic contact layer, the gate insulator and the exposed portion of the gate wiring;

depositing a resist film on the second conductive material layer;

etching the second conductive material layer to form a source electrode, a drain electrode, a source wiring, a source terminal, and a gate terminal electrically connected to said gate wiring through a contact hole formed in the gate insulator, wherein all of the source wiring, gate wiring, source terminal and gate terminal are covered by at least one of the gate insulator and the resist film after etching, and wherein the ohmic contact layer is exposed during etching; and forming a channel of said thin film transistor device by etching the ohmic contact layer to expose a portion of the semiconductor film.

8. The method of manufacturing a thin film transistor device according to claim 7, wherein the step of etching the second conductive material layer further comprises forming a guard conductor connected between the source terminal and the drain terminal.

9. The method of manufacturing a thin film transistor device according to claim 7, wherein the step of depositing the first conductive material layer comprises depositing indium tin oxide.

10. The method of manufacturing a thin film transistor device according to claim 7, wherein the step of depositing the first conductive material layer comprises depositing copper.

11. The method of manufacturing a thin film transistor device according to claim 7, further comprising the steps of:

after the step of forming the channel, removing the resist film covering the source electrode, drain electrode, source wiring, source terminal and gate terminal;

depositing a passivation layer; and exposing portions of the source terminal and the gate terminal through the passivation layer.

12. The method of manufacturing a thin film transistor device according to claim 7, wherein the step of depositing the semiconductor film comprises depositing amorphous silicon having a thickness within the range of 20 to 60 nm.

* * * * *